US006507498B1

(12) United States Patent
Klee et al.

(10) Patent No.: US 6,507,498 B1
(45) Date of Patent: Jan. 14, 2003

(54) MULTIPLE-COMPONENT UNIT

(75) Inventors: Mareike K. Klee, Hückelhoven-Randerath (DE); Hans P. Lobl, Monschau-Imgenbroich (DE); Rainer Kiewitt, Roetgen (DE); Paul H. P. Van Oppen, Roermond (NL); Robert J. A. Derksen, Eindhoven (NL); Hans-Wolfgang Brand, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/491,626

(22) Filed: Jan. 26, 2000

(30) Foreign Application Priority Data

Jan. 28, 1999 (DE) .......................................... 199 03 456

(51) Int. Cl.[7] .............................................. H03H 1/02

(52) U.S. Cl. .................... 361/793; 361/301.4; 361/303; 361/309; 361/313; 361/321.2; 361/321.4; 361/763; 361/766; 361/795

(58) Field of Search .............................. 361/301.4, 303, 361/305, 309, 312, 313, 321.2, 321.4, 734, 738, 763, 766, 780, 792–795, 816, 818; 174/255; 333/12, 185

(56) References Cited

U.S. PATENT DOCUMENTS 4,714,981 A * 12/1987 Gordon ...................... 361/738
4,795,670 A * 1/1989 Nishigaki et al. ........... 361/792
5,548,474 A * 8/1996 Chen et al. ................. 361/313
5,576,925 A * 11/1996 Gorowitz et al. ........ 361/321.2
5,889,445 A * 3/1999 Ritter et al. ............. 361/321.2

FOREIGN PATENT DOCUMENTS

JP 03-203212 A * 9/1991 ............ H01G/4/40

OTHER PUBLICATIONS

13–2–4, "Generation of PN Sequences", Digital Communications, Chapter 13: Spread Spectrum Signals for Digital Communications, pp 724–729.

* cited by examiner

*Primary Examiner*—Kamand Cuneo
*Assistant Examiner*—John B. Vigushin
(74) *Attorney, Agent, or Firm*—Ernestine C. Bartlett

(57) ABSTRACT

The invention relates to a multiple-component unit in which at least two passive components have been realized one above the other. A multiple-component unit thus comprises at least one resistor and at least one capacitor, or at least two capacitors. This space-saving construction allows for a miniaturization of circuits. A further miniaturization can be achieved in that the multiple-component units are not manufactured as discrete components, but are integrated into ICs.

22 Claims, 3 Drawing Sheets

7 6 9 5 4 8 3 2 1 8

MULTIPLE-COMPONENT UNIT

BACKGROUND OF THE INVENTION

The invention relates to an electronic multiple-component unit with at least a first and a second current supply contact, a substrate layer, a resistance layer disposed thereon and connected to the first current supply contact, at least one dielectric layer disposed over the resistance layer, and at least a first electrode disposed thereon and connected to the second current supply contact.

The invention also relates to a multiple-component unit with at least a first and a second current supply contact, a substrate layer, a first electrode disposed thereon, and at least a first and a second dielectric layer alternating with at least a second and a third electrode disposed on said first electrode.

Voltage supply units which are to be uncoupled from the AC signals in most applications are used in many electronic circuits. Passive components in the form of X7R capacitors, NP0 capacitors, and resistors are used nowadays in amplifier circuits for mobile telephones, in the vicinity of GaAs ICs, and for interference pulse filtering of microprocessors with high frequency clocks. Discrete X7R capacitors and discrete NP0 capacitors are connected in parallel in many circuits. Resistors are connected in parallel to the X7R capacitors in some circuits.

These passive components in amplifier circuits have the function inter alia of efficiently filtering interference frequencies from the supply lines so as to safeguard a constant supply voltage. This filtering in the range from a few MHz to a few hundred MHz is usually performed by an X7R capacitor. A resistor connected in series here has the task of preventing parallel resonances and avoiding undesired oscillations. An NP0 capacitor connected in parallel to the X7R capacitor is used inter alia to filter frequencies of a few hundred MHz, preferably the operating frequency for which the circuit was dimensioned, from the DC supply line.

The increasing miniaturization of portable electronic appliances and the increasing functionality of these systems render it necessary to miniaturize the passive components present in the circuits so as to make the circuits as small as possible.

In the present state of the art, small discrete passive components are widely used with the dimension 0402. Given a lateral dimension of $0.5 \cdot 1$ $mm^2$ for these components, a considerable amount of space is still required for each individual element, in spite of its small dimensions, because of its soldering onto the circuit board. At the same time, mounting of such small components is technically intricate and expensive.

A method of increasing the packing density of circuit elements is known from publication no. 03203212 A of "Patent Abstracts of Japan". In this method, a capacitor is mounted on the upper surface of any passive or active component, as desired.

A further possibility for miniaturization and cost reduction is the integration of passive components in ICs.

SUMMARY OF THE INVENTION

The invention has for its object further to reduce the size of components and accordingly also of the resulting circuits and to facilitate the mounting of the components.

This object is achieved by means of an electronic multiple-component unit with at least a first and a second current supply contact, a substrate layer, a resistance layer disposed thereon and connected to the first current supply contact, at least one dielectric layer disposed over the resistance layer, and at least a first electrode disposed thereon and connected to the second current supply contact.

This arrangement has the advantage that, with a resistor and a capacitor connected in series, two passive components are realized in a single unit.

In a preferred embodiment of this multiple-component unit, a further dielectric layer and a second electrode which is connected to the first current supply contact are provided on the first electrode. Besides a resistor and a capacitor, a further capacitor has now been integrated into this multiple-component unit.

In a favorable embodiment of this multiple-component unit, the second electrode is connected to the resistance layer. The further capacitor in this embodiment of the multiple-component unit is connected in parallel to the other two components.

In a further preferred embodiment of the multiple-component unit, a second and a third dielectric layer and a second and a third electrode are provided in an alternating arrangement on the first electrode, such that the second electrode is connected to the first current supply contact and the third electrode to the second current supply contact. In this multiple-component unit, a further capacitor has been integrated, so that a total of four passive components have been combined.

In an advantageous embodiment of this multiple-component unit, the second electrode is connected to the resistance layer and the third electrode is connected to the first electrode. The second and third capacitors are thus connected in parallel to the series-connected resistance and first capacitor.

It is preferred that the resistance layer is made from a material comprising a metal, or an alloy, or a conductive oxide, or a metal and an alloy, or a metal and a conductive oxide, or a metal, an alloy and a conductive oxide, or a conductive metal nitride. After being deposited, the materials are structured into a resistance layer, for example by means of photolithographical processes in combination with wet and dry etching steps.

It may be preferred that the electrodes have a resistance value and that they are made from a material comprising a metal, or an alloy, or a conductive oxide, or a metal and an alloy, or a metal and a conductive oxide, or a metal, an alloy and a conductive oxide, or a conductive metal nitride. After being deposited on the dielectric layer, the materials are structured, for example by means of photolithographical processes in combination with wet and dry etching steps, into a resistor-like layer. In this embodiment, the multiple-component units will comprise several resistors which at the same time form the electrodes of the capacitors.

It is furthermore preferred that the first dielectric layer lying on the resistance layer has a dielectric constant value of $K>7$. High capacitance values combined with small dimensions are achieved with this capacitor on account of the high dielectric constant value of the dielectric layer.

It is provided in the preferred embodiments of the multiple-component unit that the second and third dielectric layers have dielectric constant values of $K>3$. The second and third capacitors have lower capacitance values.

The invention further relates to an electronic multiple-component unit with at least a first and a second current supply contact, a substrate layer, at least a first electrode disposed thereon and connected to the first current supply contact, and disposed thereon at least a first and a second dielectric layer in an alternating arrangement with at least a second and a third electrode, the second electrode being connected to the second current supply contact and the third electrode to the first current supply contact.

This multiple-component unit has the advantage that two passive components, two capacitors in this case, are realized one above the other in a single unit.

A preferred embodiment of this multiple-component unit provides that the first and the second dielectric layer are both made from a dielectric material having the same dielectric properties.

Alternatively, it may be preferred that the first and the second dielectric layer are made from dielectric materials which have different dielectric properties, the dielectric constant of the first dielectric layer being greater than the dielectric constant of the second dielectric layer.

Capacitors having the desired capacitance values and characteristics may thus be manufactured and used in dependence on the type and application of the circuit.

It is advantageous when in all multiple-component units the substrate layer comprises a ceramic material, a ceramic material with a glass planarization, a glass-ceramic material, a glass material, or silicon. A substrate layer of a ceramic material, a ceramic material with glass planarization, a glass-ceramic material, or a glass substrate can be inexpensively manufactured, so that the process cost for these components can be kept low. If the multiple-component unit is to be integrated into an IC, the substrate layer will be of silicon, possibly provided with a $SiO_2$ passivating layer.

It may be preferred that the electrodes are made from a material comprising a metal, or an alloy, or a conductive oxide, or a metal and an alloy, or a metal and a conductive oxide, or a metal, an alloy and a conductive oxide, or a conductive metal nitride. After being deposited on the dielectric layers, these materials are structured, for example by means of photolithographical processes in combination with wet and dry etching steps, so as to form electrodes.

Each multiple-component unit can be electrically coupled to further components of the circuit at the current supply contacts, which usually lie at opposite sides of the unit. Depending on the type of application or the type of component mounting, an electroplated SMD end contact or a bump end contact or a contact surface may be used. The use of SMD end contacts, for example made from Cr/Cu, Ni/Sn or Cr/Cu, Cu/Ni/Sn or Cr/Ni, Pb/Sn, or bump end contacts renders possible the manufacture of discrete multiple-component units, whereas the use of contact surfaces enables an integration of the multiple-component units in ICs.

It may also be preferred that a barrier layer is present on the substrate layer in all multiple-component units for the purpose of avoiding reactions with the dielectric or short-circuits in the case of substrate layer materials with rough surfaces.

It may in addition be preferred that a protective layer of an inorganic and/or organic material is disposed over the entire multiple-component unit. The protective layer protects the subjacent layers against mechanical loads.

It may also be preferred that a glass layer or a glass plate is provided on the protective layer. This additional layer protects the multiple-component unit from moisture and corrosion.

DETAILED DESCRIPTION OF THE INVENTION

Figure 1:
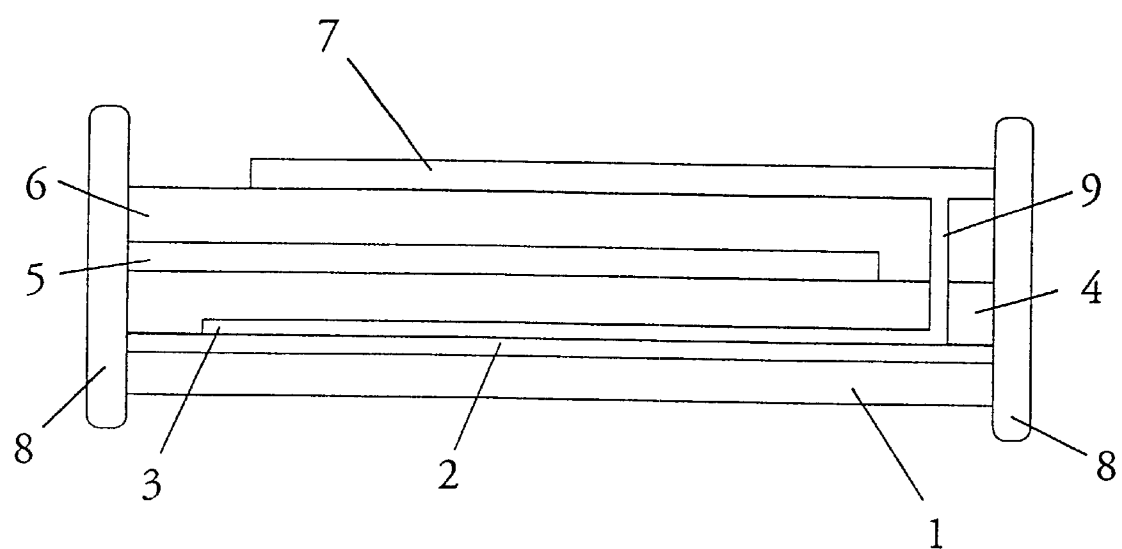
FIG. 1 shows the construction of a multiple-component unit comprising one resistor and two capacitors in a diagrammatical cross-sectional view.

The invention will now be described in greater detail with reference to the figures of the drawing and the embodiments that follow.

In FIG. 1. a multiple-component unit comprises a substrate layer 1 made, for example, from a ceramic material. a ceramic material with a glass planarization, a glass-ceramic material, a glass material, or silicon. A barrier layer 2, for example made of $TiO_2$, $Al_2O_3$ or $ZrO_2$, and a resistance layer 3 which also serves as an electrode are provided on the substrate layer 1. This resistance layer 3 may be, for example, a layer of Ti (10 to 20 nm)/Pt (20 to 600 nm), Ti (10 to 20 nm)/Pt (20 to 600 nm)/Ti (5 to 20 nm), $Ti/Ag_{1-x}Pt_x$ ($0 \leq x \leq 1$), $Ti/Ag_{1-x}Pd_x$ ($0 \leq x \leq 1$), $Ti/Pt_{1-x}Al_x$ ($0 \leq x \leq 1$), $Pt_{1-x}Al_x$ ($0 \leq x \leq 1$), $Ti/RuO_x$ ($0 \leq x \leq 2$), $RuO_x$ ($0 \leq x \leq 2$), $Ti/Ir/IrO_x$ ($0 \leq x \leq 2$), $IrO_x$ ($0 \leq x \leq 2$), $RhO_x$ ($0 \leq x \leq 2$), $Ni_xCr_y$ ($0 \leq x \leq 1$, $0 \leq y \leq 1$), $Ni_xCr_yAl_z$ ($0 \leq x \leq 1$, $0 \leq y \leq 1$, $0 \leq z \leq 1$), $Ti_xW_yN_z$ ($0 \leq x \leq 1$, $0 \leq y \leq 1$, $0 \leq z \leq 1$), $Ta_xN_y$ ($0 \leq x \leq 1$, $0 \leq y \leq 1$), $Si_xCr_yO_z$ ($0 \leq x \leq 1$, $0 \leq y \leq 1$, $0 \leq z \leq 1$), $Si_xCr_yN_z$ ($0 \leq x \leq 1$, $0 \leq y \leq 1$, $0 \leq z \leq 1$), polysilicon, $Ti_xW_y$ ($0 \leq x \leq 1$, $0 \leq y \leq 1$), $Cu_xNi_y$ ($0 \leq x \leq 1$, $0 \leq y \leq 1$), Pt (50 nm to 1 $\mu$m), Al doped with a few per cents of Cu, Ti/Pt/Al, Ti/Ag, Ti/Ag/Ti, Ni, Cu, Ti/Ag/Ir, Ti/Ir, Ti/Pd, $Ti/Ag/Pt_{1-x}Al_x$ ($0 \leq x \leq 1$), Ti/Ag/Ru, $Ti/Ag/Ir/IrO_x$ ($0 \leq x \leq 2$), Ti/Ag/Ir, $Ti/Ag/Ru/RuO_x$ ($0 \leq x \leq 2$), $Ti/Ag/Ru/Ru_xPt_{1-x}$ ($0 \leq x \leq 1$), $Ti/Ag/Ru_xPt_{1-x}/RuO_y$ ($0 \leq x \leq 1$, $0 \leq y \leq 2$), $Ti/Ag/Ru/RuO_x/Ru_yPt_{1-y}$ ($0 \leq x \leq 2$, $0 \leq y \leq 1$), $Ti/Ag/Ru_xPt_{1-x}$ ($0 \leq x \leq 1$), $Ti/Ag/Pt_xA_{1-x}$ ($0 \leq x \leq 1$), $Pt_xAl_{1-x}/Ag/Pt_yAl_{1-y}$ ($0 \leq x \leq 1$, $0 \leq y \leq 1$), $Ti/Ag/Pt_y(RhO_x)_{1-y}$ ($0 \leq x \leq 2$, $0 \leq y \leq 1$), $Ti/Ag/Rh/RhO_x$ ($0 \leq x \leq 2$), $Ti/Ag/Pt_xRh_{1-x}$ ($0 \leq x \leq 1$), $Ti/Ag/Pt_y(RhO_x)_{1-y}/Pt_zRh_{1-z}$ ($0 \leq x \leq 2$, $0 \leq y \leq 1$, $0 \leq z \leq 1$), $Ti/Ag_xPt_{1-x}/Ir$ ($0 \leq x \leq 1$), $Ti/Ag_xPt_{1-x}/Ir/IrO_y$ ($0 \leq x \leq 1$, $0 \leq y \leq 2$), $Ti/Ag_xPt_{1-x}/Pt_yAl_{1-y}$ ($0 \leq x \leq 1$, $0 \leq y \leq 1$), $Ti/Ag_xPt_{1-x}/Ru$ ($0 \leq x \leq 1$), $Ti/Ag_xPt_{1-x}/Ru/RuO_y$ ($0 \leq x \leq 1$, $0 \leq y \leq 2$), Ti/Ag/Cr, Ti/Ag/Ti/ITO, Ti/Ag/Cr/ITO, Ti/Ag/ITO, Ti/Ni/ITO, Ti/Ni/Al/ITO, Ti/Ni, Ti/Cu, ITO or Ti/ITO. On this resistance layer 3 is disposed a dielectric layer 4 with a dielectric constant K>7 and comprising, for example, $PbZr_xTi_{1-x}O_3$ (x=0 to 1) with and without excess lead, $Pb_{1-\alpha y}La_yZr_xTi_{1-x}O_3$ ($0 \leq x \leq 1$, $0 \leq y \leq 0.2$, $1.3 \leq \alpha \leq 1.5$), $Pb_{1-\alpha x}La_xTiO_3$ ($0 \leq x \leq 0.3$, $1.3 \leq \alpha \leq 1.5$). $(Pb,Ca)TiO_3$, $BaTiO_3$, $BaTiO_3$ doped with Ce, $BaTiO_3$ doped with Nb and/or Co, $BaZr_xTi_{1-x}O_3$ ($0 \leq x \leq 1$), $Ba_{1-x}Pb_xTiO_3$ ($0 \leq x \leq 1$), $Ba_{1-y}Sr_yZr_xTi_{1-x}O_3$ ($0 \leq x \leq 1$, $0 \leq y \leq 1$). $Ba_{1-x}Sr,TiO_3$ ($0 \leq x \leq 1$) with and without Mn dopants. $SrTiO_3$ with dopants of, for example, La, Nb, Fe or Mn, $SrZr_xTi_{1-x}O_3$ ($0 \leq x \leq 1$), $CaO_xZnO_y(Nb_2O_5)_z$ (x=0.01 to 0.05, y=0.43 to 0.55, z=0.44 to 0.52), $(BaTiO_3)_{0.18}$ to $_{0.27}$+$(Nd_2O_3)_{0.316}$ to $_{0.355}$+$(TiO_2)_{0.276}$ to $_{0.355}$+$(Bi_2O_3)_{0.025}$ to $_{0.081}$+x ZnO, $CaTiO_3+CaTiSiO_5$. $(Sr,Ca)(Ti,Zr)O_3$, $(Sr,Ca,M)(Ti,Zr)O_3$ (M=Mg or Zn), $(Sr,Ca,Mg,Zn)(Ti,Zr,Si)O_3$, $(Sr,Ca,Cu,Mn,Pb)TiO_3+Bi_2O_3$, $BaO—TiO_2—Nd_2O_3—Nb_2O_5$, $(Bi_2O_3),(Nb_2O_5)_{1-x}$ and additives of $SiO_2$, $MnO_2$ or PbO, $BaTiO_3$ with $Nb_2O_5$, CoO, $CeO_2$, ZnO and manganese oxydes as dopants, $BaTiO_3+CaZrO_3$, additives of $MnO_2$, MgO and rare earth oxydes. $(Ba.Ca)TiO_3+Nb_2O_5$, $Co_2O_3$ or $MnO_2$, $Ba_2Ti_9O_{20}$, $Ba_2Ti_{9-x}Zr_xO_{20}$ x=0 to 1) with and without Mn dopants. $BaTi_5O_{11}$, $BaTi_4O_9$, $Ca_xSm_yTi_zO_n$ ($0 \leq x \leq 1$, $0 \leq y \leq 1$, $0 \leq z \leq 1$, $0 \leq n \leq 1$). Zr (Ti, Sn)$O_4$, $TiO_2$, $Ta_2O_5$, $(Ta_2O_5)_x—(Al_2O_3)_{1-x}$ ($0 \leq x \leq 1$).

$(Ta_2O_5)_x$—$(TiO_2)_{1-x}$ ($0 \leqq x \leqq 1$), $(Ta_2O_5)_x$—$(Nb_2O_5)_{1-x}$ ($0 \leqq x \leqq 1$), $(Ta_2O_5)_x$—$(SiO_2)_{1-x}$ ($0 \leqq x \leqq 1$), BaO—PbO—$Nd_2O_3$—$TiO_2$, $Ba(Zn,Ta)O_3$, $BaZrO_3$, $CaZrO_3$, $Nd_2Ti_2O_7$, $(Ba,Ca,Sr)(Ti,Zr)O_3$+$Li_2O$, $SiO_2$, $B_2O_3$, $[Bi_3(Ni_2Nb)O_9]_{1-x}$—$(Bi_2(ZnNb_{2(1+d)y}O_{3+6y+5yd})_x$ ($0 \leqq x \leqq 1$, $0.5 \leqq y \leqq 1.5$, $-0.05 \leqq d \leqq 0.05$), $PbNb_{4/5x}((Zr_{0.6}Sn_{0.4})_{1-y}Ti_y))_{1-x}O_3$ ($0 \leqq x \leqq 0.9$, $0 \leqq y \leqq x \leqq 1$). $[Pb(Mg_{1/3}Nb_{2/3})O_3]_x$—$(PbTiO_3)_{1-x}$ (x=1 to 0), (Pb,Ba, Sr) $(Mg_{1/3}Nb_{2/3})_xTi_y(Zn_{1/3}Nb_{2/3})_{1-x-y}O_3$ ($0 \leqq x \leqq 1, 0 \leqq y \leqq 1$, $x+y \leqq 1$).

i) $Pb(Mg_{0.5}W_{0.5})O_3$
ii) $Pb(Fe_{0.5}Nb_{0.5})O_3$
iii) $Pb(Fe_{2/3}W_{1/3})O_3$
iv) $Pb(Ni_{1/3}Nb_{2/3}O_3$
v) $Pb(Zn_{1/3}Nb_{2/3})O_3$
vi) $Pb(Sc_{0.5}Ta_{0.5})O_3$ as well as combinations of the compounds i) to vi) with $PbTiO_3$ and/or $Pb(Mg_{1/3}Nb_{2/3})O_3$ with and without excess lead. A first electrode 5, on top of this a second dielectric layer 6, and then a second electrode 7 are provided on this dielectric layer 4. The material for the electrodes 5 and 7 may be, for example, Pt. Ti (10 to 20 nm)/Pt (20 to 600 nm), Ti (10 to 20 nm)/Pt (20 to 600 nm)/Ti (5 to 20 nm), Al, Al with a few per cents of Cu. Al with a few per cents of Mg, Al with a few per cents of Si, Ti/Pt/Al, Ti/Ag, Ti/Ag/Ti, Ni, Cu, Ti/Ag/Ir, Ti/Ir, Ti/Pd, Ti/$Ag_{1-x}Pt_x$ ($0 \leqq x \leqq 1$), Ti/$Ag_{1-x}Pd_x$ ($0 \leqq x \leqq 1$), Ti/$Pt_{1-x}Al_x$ ($0 \leqq x \leqq 1$), $Pt_{1-x}Al_x$ ($0 \leqq x \leqq 1$), Ti/Ag/$Pt_{1-x}Al_x$ ($0 \leqq x \leqq 1$), Ti/Ag/Ru, Ti/Ag/Ir/$IrO_x$ ($0 \leqq x \leqq 2$), Ti/Ag/Ru/$RuO_x$ ($0 \leqq x \leqq 2$), Ti/Ag/Ru/$Ru_x$ $Pt_{1-x}$ ($0 \leqq x \leqq 1$) Ti/Ag/Ru/$Ru_xPt_1$_/$RuO_y$ ($0 \leqq x \leqq 1$, $0 \leqq y \leqq 2$), Ti/Ag/Ru/$RuO_x$/$Ru_yPt_{1-y}$ ($0 \leqq x \leqq 2$, $0 \leqq y \leqq 1$), Ti/Ag/$Ru_xPt_{1-x}$ ($0 \leqq x \leqq 1$), Ti/Ag/$Pt_xAl_{1-x}$ ($0 \leqq x \leqq 1$), $Pt_xAl_{1-x}$/Ag/$Pt_yAl_{1-y}$ ($0 \leqq x \leqq 1$, $0 \leqq y \leqq 1$), Ti/Ag/$Pt_y(RhO_x)_{1-y}$ ($0 \leqq x \leqq 2$, $0 \leqq y \leqq 1$), Ti/Ag/Rh/$RhO_x$ ($0 \leqq x \leqq 2$), Ti/Ag/$Pt_xRh_{1-x}$ ($0 \leqq x \leqq 1$), Ti/Ag/$Pt_y(RhO_x)_{1-y}$/$Pt_z$/$Rh_{1-z}$ ($0 \leqq x \leqq 2$, $0 \leqq y \leqq 1$, $0 \leqq z \leqq 1$), Ti/$Ag_xPt_{1-x}$/Ir ($0 \leqq x \leqq 1$), Ti/$Ag_xPt_{1-x}$/Ir/$IrO_y$ ($0 \leqq x \leqq 1$, $0 \leqq y \leqq 2$), Ti/$Ag_xPt_{1-x}$/$Pt_yAl_y$ ($0 \leqq x \leqq 1$, $0 \leqq y \leqq 1$), Ti/$Ag_xPt_{1-x}$/Ru ($0 \leqq x \leqq 1$), Ti/$Ag_xPt_{1-x}$/Ru/$RuO_y$ ($0 \leqq x \leqq 1$, $0 \leqq y \leqq 2$), Ti/Ag/Cr, Ti/Ag/Ti/ITO. Ti/Ag/Cr/ITO, Ti/Ag/ITO, Ti/Ni/ITO, Ti/Ni/Al/ITO, Ti/Ni, Ti/Cu, $Ni_xCr_y$ ($0 \leqq x \leqq 1$, $0 \leqq y \leqq 1$), $Ni_xCr_yAl_z$ ($0 \leqq x \leqq 1$, $0 \leqq y \leqq 1$, $0 \leqq z \leqq 1$), $Ti_xW_yN_z$ ($0 \leqq x \leqq 1$, $0 \leqq y \leqq 1$, $0 \leqq z \leqq 1$), $Ta_xN_y$ ($0 \leqq x \leqq 1$, $0 \leqq y \leqq 1$), $Si_xCr_yO_z$ ($0 \leqq x \leqq 1$, $0 \leqq y \leqq 1$, $0 \leqq z \leqq 1$), $Si_xCr_yN_z$ ($0 \leqq x \leqq 1$, $0 \leqq y \leqq 1$, $0 \leqq z \leqq 1$), $Ti_xW_y$ ($0 \leqq x \leqq 1$, $0 \leqq y \leqq 1$) or $Cu_xNi_y$ ($0 \leqq x \leqq 1$, $0 \leqq y \leqq 1$). The dielectric layer 6 has a dielectric constant K>3 and is made from, for example, $Si_3N_4$, $SiO_2$, $Si_xN_yO_z$ ($0 \leqq x \leqq 1$, $0 \leqq y \leqq 1$, $0 \leqq z \leqq 1$), $Al_2O_3$, $Ta_2O_5$, $(Ta_2O_5)_x$—$(Al_2O_3)_{1-x}$ ($0 \leqq x \leqq 1$), $(Ta_2O_5)_x$—$(TiO_2)_{1-x}$ ($0 \leqq x \leqq 1$), $(Ta_2O_5)_x$—$(Nb_2O_5)_{1-x}$ ($0 \leqq x \leqq 1$), $(Ta_2O5)_x$—$(SiO_2)_{1-x}$ ($0 \leqq x \leqq 1$), $TiO_2$, $SrZr_xTi_{1-x}O_3$ ($0 \leqq x \leqq 1$) with and without Mn dopants, $CaO_xZnO_y(Nb_2O_5)_z$ (x=0.01 to 0.05, y=0.43 to 0.55, z=0.44 to 0.52), $(BaTiO_3)_{0.18}$ to $_{0.27}$+$(Nd_2O_3)_{0.316}$ to 0.355+$(TiO_2)_{0.276}$ to 0.355+$(Bi_2O_3)_{0.025}$ to $_{0.081}$+x ZnO, $CaTiO_3$+$CaTiSiO_5$, (Sr,Ca)(Ti,Zr)$O_3$, (Sr,Ca, M)(Ti,Zr)$O_3$ (M=Mg oder Zn). (Sr,Ca,Mg,Zn)(Ti,Zr,Si)$O_3$, (Sr,Ca,Cu,Mn,Pb)$TiO_3$+$Bi_2O_3$, BaO—$TiO_2$—$Nd_2O_3$—$Nb_2O_5$, Zr(Ti,Sn)$O_4$, BaO—PbO—$Nd_2O_3$—$TiO_2$, Ba(Zn, Ta)$O_3$, $BaZrO_3$, $Ba_2Ti_9O_{20}$, $Ba_2Ti_{9-x}Zr_xO_{20}$ ($0 \leqq x \leqq 1$) with and without Mn dopants, $BaTi_5O_{11}$, $BaTi_4O_9$, $Ca_xSm_yTi_zO_n$ ($0 \leqq x \leqq 1$. $0 \leqq y \leqq 1$, $0 \leqq z \leqq 1$, $0<n \leqq 1$), $[Bi_3(Ni_2Nb)O_9]_{1-x}$—$(Bi_2(ZnNb_{2(1+d)y}O_{3+6y+5yd})_x$ ($0 \leqq x \leqq 1$, $0.5 \leqq y \leqq 1.5$, $-0.05 \leqq d \leqq 0.05$), $CaZrO_3$ or $Nd_2Ti_2O_7$. Furthermore, current supply contacts 8 are fastened to mutually opposed sides of the multiple-component unit. An electroplated SMD end contact of, for example, Cr/Cu, Ni/Sn or Cr/Cu, Cu/Ni/Sn or Cr/Ni, Pb/Sn. or a bump end contact, or a contact surface may be used as the current supply contact. The second electrode 7 is connected to the resistance layer 3 through a via 9 in the dielectric layers 4 and 6 by means of, for example, aluminum, aluminum doped with copper, copper, platinum, or nickel.

Alternatively, a protective layer comprising an inorganic material such as, for example, $Si_3N_4$ or $SiO_2$ and/or an organic material such as, for example, polyimide or polybenzocyclobutene may be provided over the entire multiple-component unit.

In addition, a glass layer or glass plate may be provided over the protective layer. The contact between the second electrode 7 and the resistance layer 3 may also be established in that portions of the dielectric layers 4 and 6 are removed at one side of the multiple-component unit, for example through etching, before the material for the second electrode 7 is provided. A contact with the exposed resistance layer 3 is made when the material for the second electrode 7 is applied.

Figure 2:
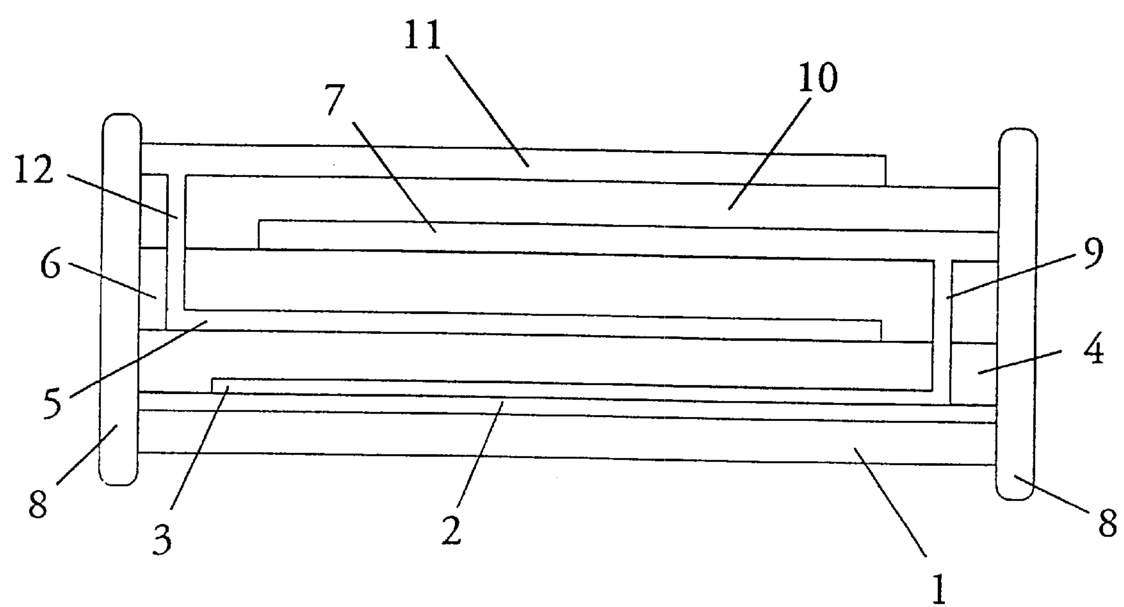
FIG. 2 shows the construction of a multiple-component unit comprising two resistors and three capacitors in a diagrammatical cross-sectional view.

FIG. 2 shows a basic construction similar to that of FIG. 1, but it has an additional third dielectric layer 10 and a third electrode 11. The dielectric layer 10 has a dielectric constant K>3 here and may comprise the same materials as the dielectric layer 6. The third electrode 11 comprises the same materials as the second electrode 7. The third electrode 11 is connected to the first electrode 5 through a via 12 in the dielectric layers 6 and 10 by means of, for example, aluminum, aluminum doped with copper, copper, platinum, or nickel.

The electrodes 5, 7, and 11 may alternatively be given a resistance value and be constructed like resistors. They may comprise in addition to the materials listed above also, for example, polysilicon.

Figure 3:
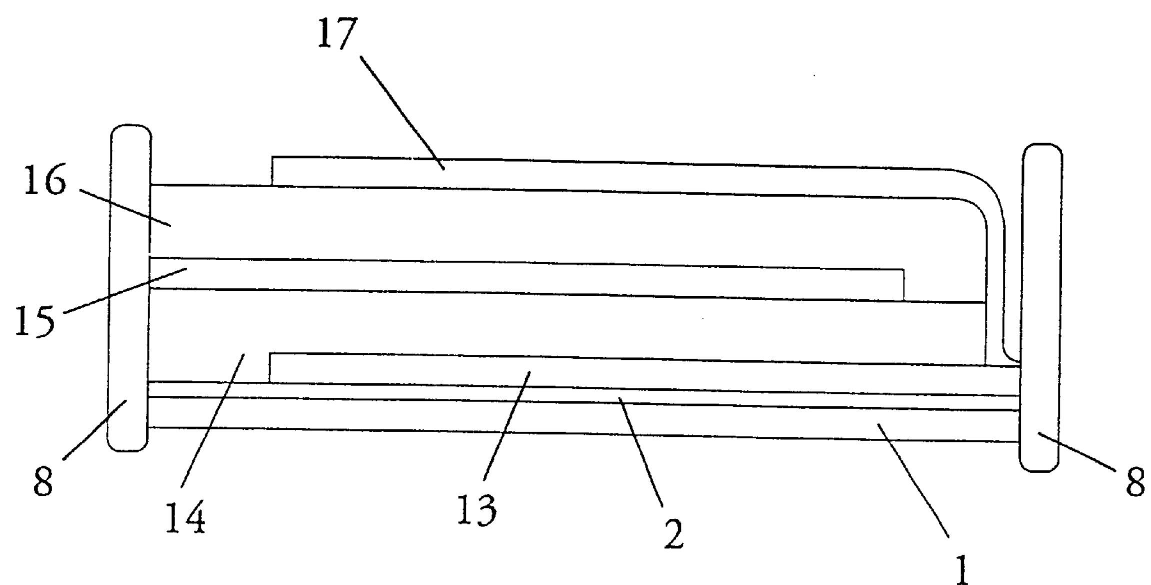
FIG. 3 shows the construction of a multiple-component unit comprising two capacitors in a diagrammatical cross-sectional view.

In FIG. 3, a multiple-component unit comprises a substrate layer 1 made from a ceramic material, a ceramic material with a glass planarization, a glass-ceramic material, a glass material, or silicon. On the substrate layer 1 are disposed in that order: a barrier layer 2 made from, for example. $TiO_2$, $Al_2O_3$ or $ZrO_2$. a first electrode 13, a dielectric layer 14, a second electrode 15, a second dielectric layer 16, and a third electrode 17. The electrode material of the electrodes 13. 15 and 17 may be, for example. Pt. Ti (10 to 20 nm)/Pt (20 to 600 nm), Ti (10 to 20 nm)/Pt (20 to 600 nm)/Ti (5 to 20 nm). Al, Al doped with Cu, Al doped with Mg, Al doped with Si, Ti/Pt/Al, Ti/Ag, Ti/Ag/Ti, Ni, Cu, Ti/Ag/Ir, Ti/Ir. Ti/Pd, Ti/$Ag_{1-x}Pt_x$ ($0 \leqq x \leqq 1$). Ti/$Ag_{1-x}Pd_x$ ($0 \leqq x \leqq 1$) . Ti/$Pt_{1-x}Al_x$ ($0 \leqq x \leqq 1$). $Pt_{1-x}Al_x$ ($0 \leqq x \leqq 1$), Ti/Ag/$Pt_{1-x}Al_x$ ($0 \leqq x \leqq 1$), Ti/Ag/Ru, Ti/Ag/Ir/$IrO_x$ ($0 \leqq x \leqq 2$), Ti/Ag/Ru/$RuO_x$ ($0 \leqq x \leqq 2$), Ti/Ag/Ru/$Ru_xPt_{1-x}$ ($0 \leqq x \leqq 1$), Ti/Ag/Ru/$Ru_xPt_{1-x}$/$RuO_y$ ($0 \leqq x \leqq 1$, $0 \leqq y<2$), Ti/Ag/Ru/$RuO_x$/$Ru_yPt_{1-y}$ ($0 \leqq x \leqq 2$, $0 \leqq y<1$). Ti/Ag/$Ru_xPt_{1-x}$ ($0 \leqq x \leqq 1$), Ti/Ag/$Pt_xAl_{1-x}$ ($0 \leqq x \leqq 1$), $Pt_xAl_{1-x}$/Ag/$Pt_yAl_{1-y}$ ($0 \leqq x \leqq 1$, $0 \leqq y \leqq 1$). Ti/Ag/$Pt_y(RhO_x)_{1-y}$ ($0 \leqq x \leqq 2$. $0 \leqq y \leqq 1$), Ti/Ag/Rh/$RhO_x$ ($0 \leqq x \leqq 2$), Ti/Ag/$Pt_{x-1}Rh_{1-x}$ ($0 \leqq x \leqq 1$). Ti/Ag/$Pt_y(RhO_x)_{1-y}$/$Pt_zRh_{1-z}$ ($0 \leqq x \leqq 2$, $0 \leqq y \leqq 1$, $0 \leqq z \leqq 1$), Ti/$Ag_xPt_{1-x}$/Ir ($0 \leqq x \leqq 1$). Ti/$Ag_xPt_{1-x}$/Ir/$IrO_y$ ($0 \leqq x \leqq 1$, $0 \leqq y \leqq 2$), Ti/$Ag_xPt_{1-x}$/$Pt_yAl_{1-y}$ ($0 \leqq x \leqq 1$, $0 \leqq y \leqq 1$) , Ti/$Ag_xPt_{1-x}$/Ru ($0 \leqq x \leqq 1$), Ti/$Ag_xPt_{1-x}$/Ru/$RuO_y$ ($0 \leqq x \leqq 1$, $0 \leqq y \leqq 2$). Ti/Ag/Cr, Ti/Ag/Ti/ITO, Ti/Ag/Cr/ITO, Ti/Ag/ITO, Ti/Ni/ITO Ti/Ni/Al/ITO, Ti/Ni, Ti/Cu, $Ni_xCr_y$ ($0 \leqq x \leqq 1$, $0 \leqq y \leqq 1$), $Ni_xCr_yAl_z$ ($0 \leqq x \leqq 1$,$0 \leqq y \leqq 1$, $0 \leqq z \leqq 1$), $Ti_xW_yN_z$ ($0 \leqq x \leqq 1$, $0 \leqq y \leqq 1$, $0 \leqq z \leqq 1$), $Ta_xN_y$ ($0 \leqq x \leqq 1$, $0 \leqq y \leqq 1$). $Si_xCr_yO_z$ ($0 \leqq x \leqq 1$, $0 \leqq y \leqq 1$, $0 \leqq z \leqq 1$). $Si_xCr_yN_z$ ($0 \leqq x \leqq 1$, $0 \leqq y \leqq 1$, $0 \leqq z \leqq 1$), $Ti_xW_y$ ($0 \leqq x \leqq 1$, $0 \leqq y \leqq 1$) or $Cu_xNi_y$ ($0 \leqq x \leqq 1$, $0 \leqq y \leqq 1$), The dielectric layers 14 and 16 may each comprise a dielectric material with the same dielectric properties with a dielectric constant K>7 or K>3. Alternatively, the dielectric layers 14 and 16 are made of dielectric materials with different dielectric properties, in which case the dielectric constant of the dielectric layer 14 is greater than the dielectric constant of the dielectric layer 16. The dielectric layers with a dielectric constant K>7 may comprise, for example, $PbZr_xTi_{1-x})_3$ (x=0 to 1) with and without excess lead, $Pb_{1-\alpha y}La_yZr_xTi_{1-x}O_3$ ($0 \leq x \leq 1$, $0 \leq y \leq 0.2$, $1.3<\alpha<1.5$), $Pb_{1-\alpha x}La_xTiO_3$ ($0 \leq x \leq 0.3$, $1.3<\alpha<1.5$), (Pb,Ca)$TiO_3$. $BaTiO_3$, $BaTiO_3$ with Ce doping, $BaTiO_3$ with Nb and/or Co doping, $BaZr_xTi_{1-x}O_3$ ($0 \leq x \leq 1$), $Ba_{1-x}Pb_xTiO_3$ ($0 \leq x \leq 1$), $Ba_{1-y}Sr_yZr_xTi_{1-x}O_3$ ($0 \leq x \leq 1$, $0 \leq y \leq 1$), $Ba_{1-x}Sr_xTiO_3$ (x=0 to 1) with and without Mn dopants. $SrTiO_3$ with dopants of, for example, La, Nb, Fe or Mn, $SrZr_xTi_{1-x}O_3$ (x=0 to 1) with and without Mn dopants, $CaO_xZnO_y(Nb_2O_5)_z$ (x=0.01 to 0.05, y=0.43 to 0.55, z=0.44 to 0.52), $(BaTiO_3)_{0.18}$ to $_{0.27}$+$(Nd_2O_3)_{0.316}$ to $_{0.355}$+$(TiO_2)_{0.276}$ to $_{0.355}$+$(Bi_2O_3)_{0.025}$ to $_{0.081}$+x ZnO, $CaTiO_3$+$CaTiSiO_5$, (Sr,Ca)(Ti,Zr)$O_3$, (Sr, Ca,M)(Ti,Zr)$O_3$ (M=Mg or Zn), (Sr,Ca,Mg,Zn)(Ti,Zr,Si)$O_3$, (Sr,Ca,Cu,Mn,Pb)$TiO_3$+$Bi_2O_3$, BaO—$TiO_2$—$Nd_2O_3$—$Nb_2O_5$, $(Bi_2O_3)_x(Nb_2O_5)_{1-x}$ and additives of $SiO_3$, $MnO_2$ and PbO, $BaTiO_3$ with $Nb_2O_5$, CoO, $CeO_2$, ZnO and manganese oxydes as dopants, $BaTiO_3$+$CaZrO_3$ and additives of $MnO_2$, MgO and rare earth oxydes. (Ba,Ca)$TiO_3$+$Nb_2O_5$, $Co_2O_3$ or $MnO_2$, $Ba_2Ti_9O_{20}$, $Ba_2Ti_{9-x}Zr_xO_{20}$ ($0 \leq x \leq 1$) with and without Mn dopants, $BaTi_5O_{11}$l $BaTi_4O_9$, $Ca_xSm_yTi_zO_n$ ($0 \leq x \leq 1$, $0 \leq y \leq 1$, $0 \leq z \leq 1$, $0 \leq n \leq 1$), Zr(Ti,Sn) $O_4$, $TiO_2$, $Ta_2O_5$, $(Ta_2O_5)_x$—$(Al_2O_3)_{1-x}$ ($0 \leq x \leq 1$), $(Ta_2O_5)_x$—$(TiO_2)_{1-1}$ ($0 \leq x \leq 1$), $(Ta_2O_5)_x$—$(Nb_2O_5)_x$—($0 \leq x \leq 1$), $(Ta_2O_5)_x$—$(SiO_2)_{1-x}$ ($0 \leq x \leq 1$), BaO—PbO—$Nd_2O_3$—$TiO_2$, Ba(Zn, Ta)$O_3$, $BaZrO_3$, $CaZrO_3$, $Nd_2Ti_2O_7$ (Ba,Ca,Sr)(Ti,Zr)$O_3$+ $Li_2O$, $SiO_2$ and $B_2O_3$, $[Bi_3(Ni_2Nb)O_9]_{1-x}$—$(Bi_2(ZnNb_{2(1-d)y}O_{3+6y+5yd})_x$ ($0 \leq x \leq 1$, $0.5 \leq y \leq 1.5$, $-0.05 \leq d \leq 0.05$), $PbNb_{4/5x}((Zr_{0.6}Sn_{0.4})_{1-y}Ti_y))_{1-x}O_3$ ($0 \leq x \leq 0.9$, $0 \leq y \leq 1$), $[Pb(Mg_{1/3}Nb_{2/3})O_3]_x$—$(PbTiO_3)_{1-x}$ ($0 \leq x \leq 1$), (Pb,Ba,Sr) $(Mg_{1/3}Nb_{2/3})_xTi_y(Zn_{1/3}Nb_{2/3})_{1-x-y}O_3$ ($0 \leq x \leq 1$, $0 \leq y \leq 1$, $x+y \leq 1$), i) $Pb(Mg_{0.5}W_{0.5})O_3$
ii) $Pb(Fe_{0.5}Nb_{0.5})O_3$
iii) $Pb(Fe_{2/3}W_{1/3})O_3$
iv) $Pb(Ni_{1/3}Nb_{2/3})O_3$
v) $Pb(Zn_{1/3}Nb_{2/3)O3}$
vi) $Pb(Sc_{0.5}Ta_{0.5})O_3$ as well as combinations of the compounds i) to vi) with $PbTiO_3$ and/or $Pb(Mg_{1/3}Nb_{2/3})O_3$with and without excess lead, while the dielectric layers with a dielectric constant K>3 are made of, for example, $Si_3N_4$, $SiO_2$, $Si_xN_yO_z$ ($0 \leq x \leq 1$, $0 \leq y \leq 1$, $0 \leq z \leq 1$), $Al_2O_3$, $Ta_2O_5$, $(Ta_2O_5)_x$—$(Al_2O_3)_{1-x}$ ($0 \leq x \leq 1$), $(Ta_2O_5)_x$—$(TiO_2)_{1-x}$ ($0 \leq x \leq 1$), $(Ta_2O_5)_x$—$(Nb_2O_5)_{1-x}$ ($O \leq x \leq 1$), $(Ta_2O_5)_x$—$(SiO_2)_{1-x}$ ($0 \leq x \leq 1$), $TiO_2$, $SrZr_xTi_{1-x}O_3$ ($0 \leq x \leq 1$) with and without Mn dopants, $CaO_xZnO_y(Nb_2O_5)_z$ (x=0.01 to 0.05, y=0.43 to 0.55, z=0.44 to 0.52), $(BaTiO_3)_{0.18}$ to $_{0.27}$+$(Nd_2O_3)_{0.316}$ to $_{0.355}$+$(TiO_2)_{0.276}$ to $_{0.355}$+$(Bi_2O_3)_{0.025}$ to $_{0.081}$+x ZnO, $CaTiO_3$+$CaTiSiO_5$, (Sr,Ca)(Ti,Zr)$O_3$, (Sr,Ca,M)(Ti,Zr)$O_3$ (M=Mg or Zn), (Sr,Ca,Mg,Zn)(Ti,Zr,Si)$O_3$, (Sr,Ca,Cu,Mn, Pb)$TiO_3$+$Bi_2O_3$, BaO—$TiO_2$—$Nd_2O_3$—$Nb_2O_5$, Zr(Ti,Sn) $O_4$, BaO—PbO—$Nd_2O_3$—$TiO_2$, Ba(Zn,Ta)$O_3$, $BaZrO_3$, $Ba_2Ti_9O_{20}$, $Ba_2Ti_{9-x}Zr_xO_{20}$ ($0 \leq x \leq 1$) with and without Mn dopants, $BaTi_5O_{11}$, $BaTi_4O_9$, $Ca_xSm_yTi_zO_n$ ($0 \leq x \leq 1$, $0 \leq y \leq 1$, $0 \leq z \leq 1$, $0 \leq n \leq 1$), $[Bi_3(Ni_2Nb)O_9]_{1-x}$—$(Bi_2(ZnNb_{2(1+d)y}O_{3+6y+5yd})_x$ ($0 \leq x \leq 1$. $0.5 \leq y \leq 1.5$, $-0.05 \leq d \leq 0.05$), $CaZrO_3$ or $Nd_2Ti_2O_7$. In addition, current supply contacts 8 are fastened to mutually opposed sides of the multiple-component unit. The current supply contacts 8 may be formed by an electroplated SMD end contact of, for example, Cr/Cu, Ni/Sn or Cr/Cu. Cu/Ni/Sn or Cr/Ni, Pb/Sn, or a bump end contact or a contact surface. The contact between the third electrode 17 and the first electrode 13 is achieved in that portions of the dielectric layers 14 and 16 are removed at one side of the multiple-component unit, for example through etching, before the material for the third electrode 17 is provided. When the material for the third electrode 17 is subsequently applied, a contact is formed with the exposed first electrode 13.

Alternatively, a protective layer comprising an inorganic material such as, for example, $Si_3N_4$ or $SiO_2$ and/or an organic material such as, for example, polyimide or polybenzocyclobutene may be applied over the entire multiple-component unit.

In addition, a glass layer or a glass plate may be provided over the protective layer.

The contact between the third electrode 17 and the first electrode 13 may also be made through a via 9 in the dielectric layers 14 and 16 by means of, for example, aluminum, aluminum doped with copper, copper, platinum, or nickel.

Embodiment 1

A barrier layer 2 of $TiO_2$ and a resistance layer 3 of Ti (10 to 20 nm)/Pt (20 to 600 nm) is provided on a glass substrate layer 1. On this resistance layer 3 is disposed a dielectric layer 4 of $PbZr_{0.53}Ti_{0.47}O_3$ with 5% lanthanum doping, and a first electrode 5 of Pt lies on this dielectric layer 4. On the first electrode 5, a further dielectric layer 6 of $Si_3N_4$ is provided, on which a second electrode 7 of Cu-doped Al is fastened. Furthermore, Cr/Cu, Ni/Sn end contacts 8 are fastened to both sides of the multiple-component unit. The resistance layer 3 and the second electrode 7 are interconnected through a via 9 in the dielectric layers 4 and 6 by means of Cu-doped aluminum. A protective layer of $Si_3N_4$ and polyimide is laid over the multiple-component unit.

Embodiment 2

A barrier layer 2 of $Al_2O_3$ and a resistance layer 3 of Ti (10 to 20 nm)/Pt (20 to 600 nm) are provided on a substrate layer 1 of $Al_2O_3$. This resistance layer 3 is followed by a dielectric layer 4 of $PbZr_{0.53}Ti_{0.47}O_3$ doped with 5% lanthanum. A first electrode 5 of Pt (50 nm to 1 $\mu$m) is provided on this dielectric layer 4 and structured as if it were a resistor. A further dielectric layer 6 of $Si_3N_4$ is provided on the first electrode 5. A second electrode 7 of aluminum doped with copper is deposited on the dielectric layer 6. A further dielectric layer 10 of $Si_3N_4$ is provided on the second electrode 7. A third electrode 11 of aluminum doped with copper is deposited on the dielectric layer 10. The resistance layer 3 and the second electrode 7 as well as the first electrode 5 and the third electrode 11 are interconnected by means of Cu-doped Al through vias 9 and 12 in the dielectric layers 4 and 6, and 6 and 10, respectively. End contacts 8 of Cr/Cu, Ni/Sn are furthermore provided at both sides of the multiple-component unit. A protective layer of $Si_3N_4$ and polyimide is laid over the multiple-component unit.

Embodiment 3

A barrier layer 2 of $TiO_2$ and a first electrode 13 of Ti (10 to 20 nm)/Pt (20 to 600 nm) is provided on a glass substrate layer 1. This first electrode 13 is followed by a dielectric layer 14 of $PbZr_{0.53}Ti_{0.47}O_3$ doped with 5% lanthanum, and a second Pt electrode 15 is laid on this dielectric layer 14. A further dielectric layer 16 of $PbZr_{0.53}Ti_{0.47}O_3$ doped with 5% lanthanum is provided on the second electrode 15, and a third electrode 17 of Pt is fastened on said layer 16. Cr/Cu, Ni/Sn end contacts 8 are furthermore fastened to both sides of the multiple-component unit. Portions of the dielectric layers 14 and 16 were removed from one side of the unit, for example through etching, before the application of the material for the third electrode 17. Upon being deposited, the third electrode 17 was contacted with the exposed first electrode 13. A protective layer of $Si_3N_4$ and polyimide is laid over the multiple-component unit.

What is claimed is:

1. An electronic multiple-component unit with at least a first and a second current supply contact, a substrate layer, a resistance layer disposed thereon and connected to the first current supply contact, at least a first dielectric layer disposed over the resistance layer, and at least a first electrode disposed thereon and connected directly to the second current supply contact.

2. An electronic multiple-component unit as claimed in claim 1, characterized in that a further dielectric layer and a second electrode which is connected to the first current supply contact are provided on the first electrode.

3. An electronic multiple-component unit as claimed in claim 2, characterized in that the second electrode is connected to the resistance layer.

4. An electronic multiple-component unit as claimed in claim 1, characterized in that a second and a third dielectric layer and a second and a third electrode are provided in an alternating arrangement on the first electrode, such that the second electrode is connected to the first current supply contact and the third electrode is connected to the second current supply contact.

5. An electronic multiple-component unit as claimed in claim 4, characterized in that the second electrode is connected to the resistance layer and the third electrode is connected to the first electrode.

6. An electronic multiple-component unit as claimed in claim 4, characterized in that the second and third dielectric layers have dielectric constant values of K>3.

7. An electronic multiple-component unit as claimed in claim 1, characterized in that the resistance layer is made from a material comprising a metal, or an alloy, or a conductive oxide, or a metal and an alloy, or a metal and a conductive oxide, or a metal, an alloy and a conductive oxide, or a conductive metal nitride.

8. An electronic multiple-component unit as claimed in claim 1, characterized in that the at least a first electrode has a resistance value and that they are made from a material comprising a metal, or an alloy, or a conductive oxide, or a metal and an alloy, or a metal and a conductive oxide, or a metal, an alloy and a conductive oxide, or a conductive metal nitride.

9. An electronic multiple-component unit as claimed in claim 1, characterized in that the first dielectric layer disposed over the resistance layer has a dielectric constant value of K>7.

10. An electronic multiple-component unit with at least a first and a second current supply contact, a substrate layer, at least a first electrode disposed thereon and connected to the first current supply contact, and disposed on the at least a first electrode at least a first and a second dielectric layer in an alternating arrangement with at least a second and a third electrode, the second electrode being connected to the second current supply contact and the third electrode to the first current supply contact, characterized in that the first and the second dielectric layer are made from dielectric materials which have different dielectric properties, the dielectric constant of the first dielectric layer being greater than the dielectric constant of the second dielectric layer.

11. An electronic multiple-component unit as claimed in claim 10, characterized in that the substrate layer comprises a ceramic material, a ceramic material with a glass planarization, a glass-ceramic material, a glass material, or silicon.

12. An electronic multiple-component unit as claimed in claim 10, characterized in that the at least a first electrode is made from a material comprising a metal, or an alloy, or a conductive oxide, or a metal and an alloy, or a metal and a conductive oxide, or a metal, an alloy and a conductive oxide, or a conductive metal nitride.

13. An electronic multiple-component unit as claimed in claim 10, characterized in that the at least a first current supply contact is an electroplated Surface Mount Device end contact or a bump end contact or a contact surface.

14. An electronic multiple-component unit as claimed in claim 10, characterized in that a barrier layer is present on the substrate layer.

15. An electronic multiple-component unit as claimed in claims 10, characterized in that a protective layer of an inorganic and/or organic material is disposed over the entire multiple-component unit.

16. An electronic multiple-component unit as claimed in claim 15, characterized in that a glass layer or a glass plate is provided on the protective layer.

17. An electronic multiple-component unit with at least a first and a second current supply contact, a substrate layer, at least a first electrode disposed thereon and connected to the first current supply contact, and disposed on the at least a first electrode at least a first and a second dielectric layer in an alternating arrangement with at least a second and a third electrode, the second electrode being connected to the second current supply contact and the third electrode to the first current supply contact, characterized in that a barrier layer is present on the substrate layer.

18. An electronic multiple-component unit as claimed in claim 17, characterized in that the first and the second dielectric layer are both made from a dielectric material having the same dielectric properties.

19. An electronic multiple-component unit as claimed in claim 17, characterized in that the first and the second dielectric layer are made from dielectric materials which have different dielectric properties, the dielectric constant of the first dielectric layer being greater than the dielectric constant of the second dielectric layer.

20. An electronic multiple-component unit with at least a first and a second current supply contact, a substrate layer, at least a first electrode disposed thereon and connected to the first current supply contact, and disposed on the at least a first electrode at least a first and a second dielectric layer in an alternating arrangement with at least a second and a third electrode, the second electrode being connected to the second current supply contact and the third electrode to the first current supply contact, a protective layer of an inorganic and/or organic material disposed over the entire multi-component unit, characterized in that a glass layer or a glass plate is provided on the protective layer.

21. An electronic multiple-component unit as claimed in claim 20, characterized in that the first and the second dielectric layer are both made from a dielectric material having the same dielectric properties.

22. An electronic multiple-component unit as claimed in claim 20, characterized in that that the first and the second dielectric layer are made from dielectric materials which have different dielectric properties, the dielectric constant of the first dielectric layer being greater than the dielectric constant of the second dielectric layer.

* * * * *